(12) United States Patent
Fukuda et al.

(10) Patent No.: US 8,097,829 B2
(45) Date of Patent: Jan. 17, 2012

(54) LASER PROCESSING METHOD AND LASER PROCESSING APPARATUS

(75) Inventors: Naoaki Fukuda, Osaka (JP); Kazuyoshi Kunishio, Osaka (JP); Shigeaki Nakayama, Osaka (JP)

(73) Assignee: Hitachi Zosen Corporation, Osaka (JP)

( * ) Notice: Subject to any disclaimer, the term of this patent is extended or adjusted under 35 U.S.C. 154(b) by 559 days.

(21) Appl. No.: 12/257,760

(22) Filed: Oct. 24, 2008

(65) Prior Publication Data

US 2009/0057284 A1 Mar. 5, 2009

Related U.S. Application Data

(63) Continuation of application No. PCT/JP2007/058439, filed on Apr. 18, 2007.

(30) Foreign Application Priority Data

Apr. 27, 2006 (JP) ................................. 2006-124084

(51) Int. Cl.
*B23K 26/067* (2006.01)
(52) U.S. Cl. ............. 219/121.76; 219/121.73; 219/121.8
(58) Field of Classification Search ............. 219/121.76, 219/121.73, 121.74, 121.75, 121.78, 121.79, 219/121.77
See application file for complete search history.

(56) References Cited

U.S. PATENT DOCUMENTS

| | | | | |
|---|---|---|---|---|
| 4,952,770 A | * | 8/1990 | Hayashi | 219/121.77 |
| 2002/0021723 A1 | * | 2/2002 | Amako et al. | 359/618 |
| 2005/0150876 A1 | * | 7/2005 | Menin et al. | 700/166 |

FOREIGN PATENT DOCUMENTS

| | | | |
|---|---|---|---|
| JP | 8-10970 A | | 1/1996 |
| JP | 9-300087 A | | 11/1997 |
| JP | 10-34364 A | | 2/1998 |
| JP | 10-277763 A | | 10/1998 |
| JP | 10-277764 A | | 10/1998 |
| JP | 10-314973 A | | 12/1998 |
| JP | 2002-28795 A | * | 1/2002 |
| JP | 2002-219590 A | | 8/2002 |
| JP | 2002-270994 A | | 9/2002 |
| JP | 2003-205383 A | * | 7/2003 |
| JP | 2005-238291 A | | 9/2005 |
| JP | 2006-263771 A | * | 10/2006 |

OTHER PUBLICATIONS

International Search Report issued Jul. 24, 2007 in International application No. PCT/JP2007/058439.

* cited by examiner

*Primary Examiner* — Geoffrey S Evans
(74) *Attorney, Agent, or Firm* — Brinks Hofer Gilson & Lione

(57) ABSTRACT

A laser processing method involving moving first and second laser beams relative to a workpiece, wherein the first and second laser beams have at least a differing wavelength or intensity. The method including irradiating the first and second laser beams through first and second portions, respectively, of an optical element that directs the first and second laser beams onto the workpiece, wherein irradiating the second laser beam is subsequent to the irradiating the first laser beam. The method including moving the first laser beam and the second laser beam relative to the workpiece along another direction. The method including irradiating the first and second laser beams through third and fourth portions, respectively, of the optical element, wherein the third and fourth portions are dependent on the another direction, wherein irradiating the second laser beam is subsequent to the irradiating the first laser beam.

4 Claims, 2 Drawing Sheets

LASER PROCESSING METHOD AND LASER PROCESSING APPARATUS

REFERENCE TO THE RELATED APPLICATIONS

This application is a continuation of PCT/JP2007/058439, filed on Apr. 18, 2007, which claims priority to Japanese Application No. 2006-124084 filed on Apr. 27, 2006, the entire content of which is incorporated herein by references.

BACKGROUND OF THE INVENTION

1. Field of the Invention

The present invention relates to a method for performing processing of a workpiece using laser beams, and an apparatus which implements this method.

2. Description of the Related Arts

Heretofore, when using laser beam irradiation to cut or weld a workpiece, or to remove only a specified layer from the surface of a workpiece, for example, there have been cases in which laser beams of differing intensities and wavelengths are irradiated in multiple stages, such as preliminary heat treatment and main processing, or removal of a first layer and removal of a second layer.

Japanese Patent Application Kokai Publication No. H08-10970 discloses a technology for raising the processing efficiency in such cases, which uses an array of as many laser oscillators as the number of layers to be processed, each emitting a laser beam effective to a specific layer, for example.

Moreover, Japanese Patent Application Kokai Publication No. 2002-270994 discloses a technology in which a plurality of laser oscillators for emitting laser beams of differing wavelengths are disposed so that the laser beams are emitted along the same axis, and ON/OFF control of the various laser beams is used to irradiate laser beams of differing wavelengths onto a workpiece.

In patterning of an electronic circuit board, laser processing is carried out by moving either a board or a laser beam irradiation in an X-Y direction, for example.

In the case of such patterning of an electronic circuit board, the following problems arise in the technologies of Japanese Patent Application Kokai Publication No. H08-10970 and Patent Reference 2, when laser beams of differing intensities and wavelengths are irradiated in multiple stages.

First, in the case of the technology of Japanese Patent Application Kokai Publication No. H08-10970, laser oscillators are arrayed as many as the number of layers to be processed, and thus the board or the laser beam irradiation must be moved over an extra distance in the X-direction and in the Y-direction, resulting in the problems of reduced processing efficiency and reduced productivity.

Furthermore, in the case of the technology of Japanese Patent Application Kokai Publication No. H08-10970, since there is a previously determined relative irradiation position of the laser beams emitted from the laser oscillators which are arrayed as many as the number of the layers to be processed, there is the problem that processing is impossible in cases where the board or the laser beam irradiation moves in the reverse direction.

In the case of the technology of Japanese Patent Application Kokai Publication No. 2002-270994, since laser beams of differing wavelengths are irradiated along the same axis, it is impossible to continuously process a plurality of layers. Consequently, this leads to the problems of reduced processing efficiency and reduced productivity, as when the technology of Japanese Patent Application Kokai Publication No. H08-10970 is employed.

The problems to be solved by the present invention are the reduced processing efficiency and the reduced productivity that result when the prior art is employed in patterning of an electronic circuit board, using laser beams of differing intensities and wavelengths irradiated in multiple stages.

SUMMARY OF THE INVENTION

The laser processing method of the present invention relates to a method for efficiently processing in patterning of an electronic circuit board even when laser beams of differing intensities and wavelengths are irradiated in multiple stages. The method is characterized in that a plurality of laser beams, of which at least the wavelength or the intensity is different from each other, are irradiated onto a workpiece in the sequential order of the differing intensity and wavelength. According to the method, when irradiating a workpiece with laser beams, as the laser beams and the workpiece move relative to each other, the laser beam irradiation position is changed according to the direction of their relative motion, so that the plurality of laser beams irradiate the workpiece in the above-mentioned sequential order.

Furthermore, the laser processing apparatus of the present invention is an apparatus for implementing the laser processing method of the present invention. The apparatus comprises:

a plurality of laser oscillators which emit laser beams of which at least the wavelength or the intensity differ from each other, and a stage device which moves either the laser beams or the workpiece relative to each other, and optical systems which guide the laser beams emitted from the plurality of laser oscillators to a predetermined position on the workpiece.

The optical systems are formed so as to be adjusted by means of an adjusting device to irradiate the laser beams at a predetermined position onto the workpiece in the sequential order of the differing wavelength and intensity, thereby making it possible for the processing of the workpiece to be performed by the laser beams irrespective of the direction of relative motion of the laser beams and the workpiece.

In the present invention, when the laser beams and the workpiece are caused to move relative to each other, in particular, when the laser beams are caused to move, this can be achieved by either adjusting the laser oscillators which emit the laser beams and the optical devices or adjusting the optical device while the lasers are made stationary.

In the present invention, laser processing can be accomplished efficiently, without limiting the direction of their relative motion between the laser beams and the workpiece, and without excessive movement, even in cases where laser beams with differing intensities and wavelengths are irradiated in multiple stages in patterning of an electronic circuit board.

PREFERRED EMBODIMENTS

The present invention utilizes the following constitution to achieve the objective of efficient processing in patterning of an electronic circuit board when laser beams of differing intensities and wavelengths are irradiated in multiple stages.

In the present invention, as a plurality of laser beams and the workpiece move relative to each other, the laser beam irradiation position is changed according to the direction of their relative motion, so that the laser beams irradiate the workpiece in the sequential order of the above-mentioned differing wavelengths and intensities.

EXAMPLES

Figure 1:
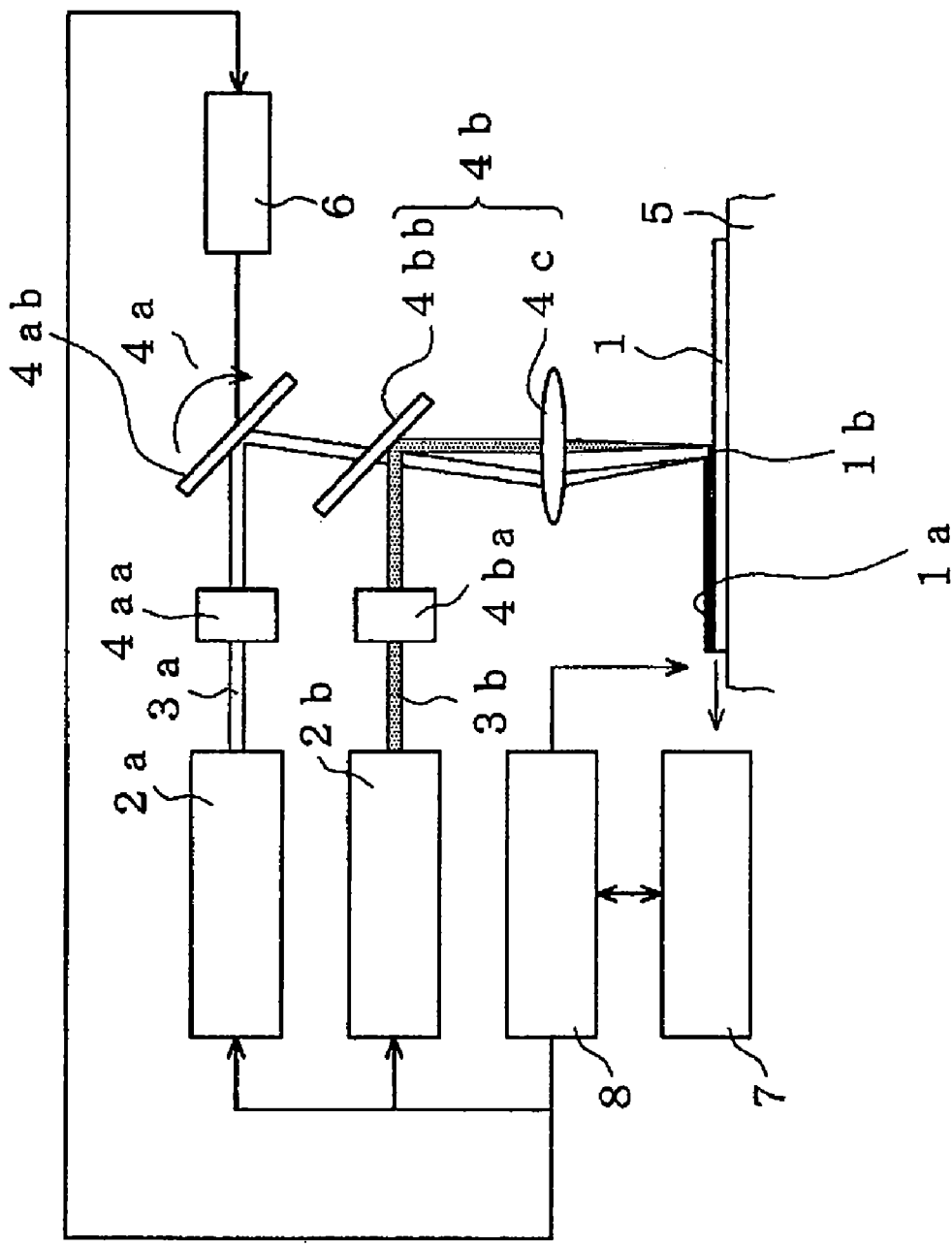
FIG. 1 is a diagram illustrating an example of the basic structure of a laser processing apparatus of the present invention.
Figure 2:
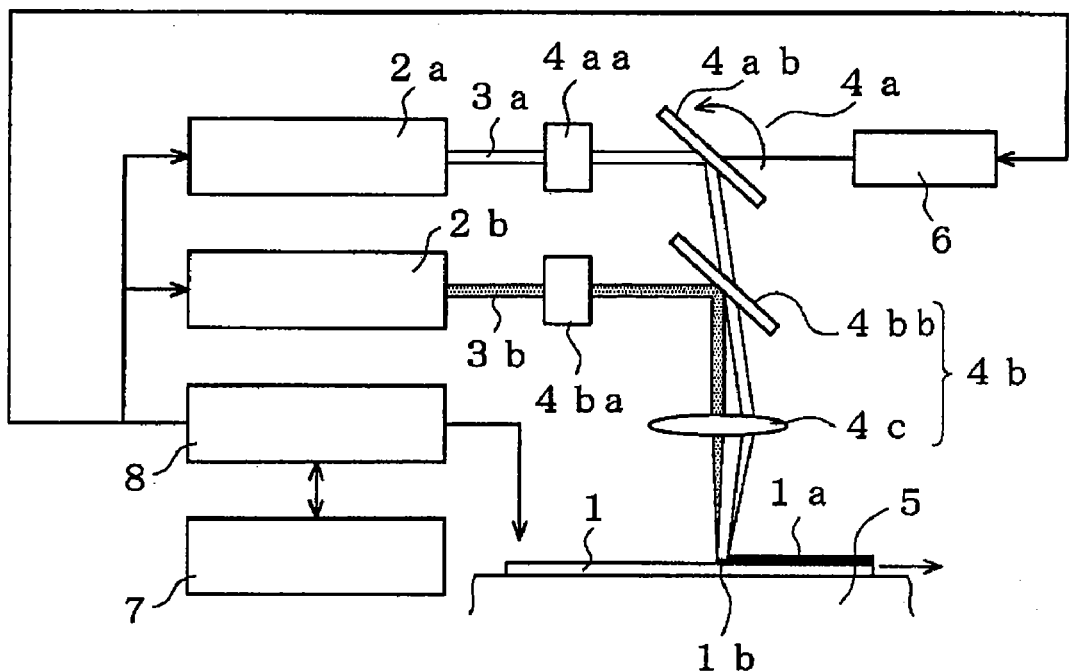
FIG. 2 is a diagram of the present invention laser processing apparatus of FIG. 1, illustrating the case where motion is in the direction opposite to that in FIG. 1.
Figure 3:
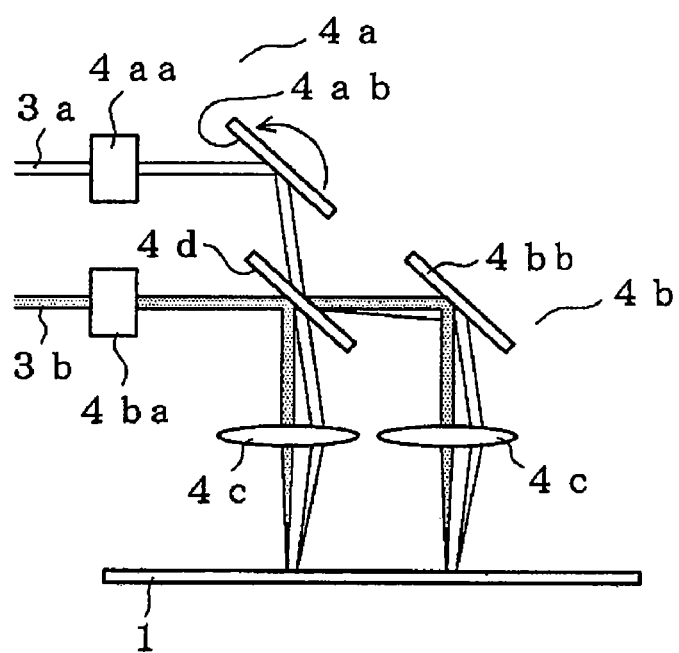
FIG. 3 is a schematic diagram illustrating the basic structure of an alternative example of a laser processing apparatus of the present invention.

Preferred embodiments are described in detail using FIG. 1 to FIG. 3.

FIG. 1 is a diagram illustrating an example of the basic structure of a laser processing apparatus of the present invention. FIG. 2 is a diagram of the present invention laser processing apparatus of FIG. 1, illustrating the case where motion is in the direction opposite to that in FIG. 1. FIG. 3 is a schematic diagram illustrating the basic structure of an alternative example of a laser processing apparatus of the present invention.

FIG. 1 shows an example of a laser processing apparatus of the present invention, for removing first and second metal layers 1a and 1b formed on a surface of a workpiece 1, such as a circuit board.

In FIGS. 1, 2a and 2b are examples of a first and a second YAG laser oscillator (referred to below simply as laser oscillators). The first laser oscillator 2a emits a laser beam 3a which has a wavelength and intensity suitable for removing the first metal layer 1a. The second laser oscillator 2b emits a laser beam 3b which has a wavelength or intensity suitable for removing the second metal layer 1b.

The first and second laser beams 3a and 3b emitted from the first and second laser oscillators 2a and 2b are mediated by first and second optical systems 4a and 4b, respectively, and are irradiated onto a surface of the workpiece 1 which is moved to the left, for example, in the drawing, being mounted on a stage device 5, so as to remove the first and second metal layers 1a and 1b.

FIG. 1 shows the first optical system 4a is formed from a first beam-forming optical system 4aa, a first reflecting mirror 4ab, and a condenser lens 4c, and the second optical system 4b is formed from a second beam-forming optical system 4ba, a second reflecting mirror 4bb, and a condenser lens 4c. However, it is not necessarily the case that this system is limited to using the same condenser lens 4c, as in FIG. 1.

In the present invention, the workpiece 1 is moved by the stage device 5 additionally to the right in the drawing, but when so moved, if the first and second optical systems 4a and 4b remain disposed as shown in FIG. 1, removal of the first and second metal layers 1a and 1b of the workpiece 1 cannot be performed properly, as is also the case in Japanese Patent Application Kokai Publication No. H08-10970.

Accordingly, the constitution of the present invention makes it possible to irradiate the first laser beam 3a on the right side as well as on the left side of the second laser beam 3b in FIG. 1, by using an adjusting mechanism 6 to change the angular position of the first reflecting mirror 4ab of the first optical system 4a, for example.

In accordance with such a constitution, even if the workpiece 1 moves to the right, to the side opposite to that in FIG. 1, it is possible to irradiate the second metal layer 1b with the second laser beam 3b, as shown in FIG. 2, after removing the first metal layer 1a by irradiating the first laser beam 3a onto the first metal layer 1a.

Using the laser processing apparatus of the present invention with the above-described constitution, the first and second metal layers 1a and 1b formed on the surface of the workpiece 1 are removed as described below.

First, as shown in FIG. 1, when the workpiece 1 moves to the left in the drawing, the position of the first reflecting mirror 4ab is set so that the first laser beam 3a irradiates the left side in the drawing, and the second laser beam 3b irradiates on the right side of the first laser beam 3a in the drawing.

In this state, a control device 8 drives the stage device 5, moving the workpiece 1 to the right side in the drawing, emits the first and second laser beams 3a and 3b from the first laser oscillator 2a and the second laser oscillator 2b to remove the first and second metal layers 1a and 1b.

When a detector 7 detects the arrival of the workpiece 1 at a return point, the control device 8 generates a command to the first and second laser oscillators 2a and 2b to suspend emission of the first and second laser beams 3a and 3b, on the basis of a signal from the detector 7.

Next, the control device 8 generates a command to the adjusting mechanism 6 to adjust the first reflecting mirror 4ab, so that the irradiation positions of the first and second laser beams 3a and 3b are the inverse of those of FIG. 1. After inversion, the control device 8 generates a command to the first and second laser oscillators 2a and 2b to re-start emission of the first and second laser beams 3a and 3b, and the control device 8 also generates a command to the stage device 5 to move the workpiece 1 to the right in FIG. 2.

The present invention is not limited to the above example, and may be suitably modified, as long as it is within the scope of the technical concepts recited in the claims.

For example, in the examples shown in FIG. 1 and FIG. 2, the first reflecting mirror 4ab is adjusted, but instead the second reflecting mirror 4bb may be adjusted.

As shown in FIG. 3, the processing area can be enlarged by adding an optical element 4d to the first and second optical systems 4a and 4b of the present invention laser processing apparatus shown in FIG. 1 and FIG. 2 in order to split laser beams 3a and 3b.

Moreover, in the examples shown in FIG. 1 and FIG. 2, when removing thin-films from the workpiece 1, the first metal layer 1a is removed, followed by the second metal layer 1b, but the first metal layer 1a may be removed after removing the second metal layer 1b.

The above examples describe cases in which thin-films are removed by irradiating laser beams on the upper surface side of the workpiece 1, but the present invention can of course also be applied in cases where a thin-film is removed from the bottom surface side by irradiating laser beams.

The present invention can be used not only for the removal of thin-films, but also for any type of laser processing such as micromachining, as long as the processing requires the irradiation of laser beams onto a workpiece.

What is claimed is:

1. A laser processing method in which a plurality of laser beams, of which at least a wavelength or an intensity is different from each other, are irradiated onto a workpiece in a sequential order of the differing wavelength and intensity to process the workpiece, the method comprising:

moving a first laser beam and a second laser beam relative to a workpiece along a first direction, wherein the first laser beam has at least a wavelength or an intensity that differs from a wavelength or an intensity of the second laser beam;

irradiating the first laser beam through a first portion of an optical element that directs the first laser beam onto the workpiece;

subsequent to the irradiating the first laser beam, irradiating the second laser beam through a second portion of the optical element that directs the second laser beam onto the workpiece, wherein the first portion is different than the second portion;

moving the first laser beam and the second laser beam relative to the workpiece along a second direction;

irradiating the first laser beam through a third portion of the optical element that directs the first laser beam onto the workpiece, wherein the third portion is dependent on the second direction;

subsequent to the irradiating the first laser beam through the third portion, irradiating the second laser beam through a fourth portion of the optical element that directs the second laser beam onto the workpiece, wherein the third portion is different than the fourth portion and the fourth position is dependent on the second direction.

2. The laser processing method of claim 1, wherein the first portion and the third portion are the center of the optical element and the second portion is at one side of the center of the optical element while the fourth portion is at another side of the center of the optical element.

3. Apparatus for laser processing, comprising:

a first laser oscillator that emits a first laser beam at a first wavelength and a first intensity;

a second laser oscillator that emits a second laser beam at a second wavelength and a second intensity, wherein the first wavelength differs from the second wavelength and/or the first intensity differs from the second intensity;

a stage device which moves either the first laser beam and the second laser beam or a workpiece relative to each other;

a first optical system that guides the first laser beam to a first portion of an optical element, which directs the first laser beam to a first predetermined position on the workpiece;

a second optical system that guides the second laser beam to a second portion of the optical element that is different than the first portion of the optical element, wherein the optical element directs the second laser beam to a second predetermined position on the workpiece;

a detector that detects a location of the stage device; and a control device in communication with the detector, the first optical system and the second optical system, wherein based on the location of the stage device detected by the detector the control device controls the first optical system and the second optical system so as to control locations of the first portion and the second portion so that the first laser beam always irradiates the workpiece prior to the second laser beam irradiating the workpiece regardless of a direction of movement of the stage device.

4. The apparatus of claim 3, wherein the control device controls the location of the first portion so that it is constantly at the center of the optical element regardless of direction of movement of the stage device and the control device controls the location of the second portion to be at either one side of the center of the optical element or at another side of the center of the optical element.

* * * * *